US006522592B2

(12) United States Patent
Van De Graaff

(10) Patent No.: US 6,522,592 B2
(45) Date of Patent: Feb. 18, 2003

(54) SENSE AMPLIFIER FOR REDUCTION OF ACCESS DEVICE LEAKAGE

(75) Inventor: Scott Van De Graaff, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/838,820

(22) Filed: Apr. 19, 2001

(65) Prior Publication Data

US 2002/0154561 A1 Oct. 24, 2002

(51) Int. Cl.[7] ................................................ G11C 7/00
(52) U.S. Cl. ........................ 365/205; 365/207; 365/149
(58) Field of Search ................................. 365/205, 207, 365/149

(56) References Cited

U.S. PATENT DOCUMENTS

| 4,141,081 A | | 2/1979 | Horne et al. ................ 365/203 |
|---|---|---|---|
| 5,091,885 A | * | 2/1992 | Ohsawa ....................... 365/203 |
| 5,113,372 A | | 5/1992 | Johnson ...................... 365/205 |
| 5,220,221 A | | 6/1993 | Casper ........................ 307/530 |
| 5,280,205 A | | 1/1994 | Green et al. ................. 307/530 |
| 5,608,668 A | | 3/1997 | Zagar et al. ................. 365/149 |
| 5,615,158 A | | 3/1997 | Ochoa et al. ................ 365/201 |
| 5,694,368 A | | 12/1997 | Lim et al. .................... 365/210 |
| 5,726,931 A | | 3/1998 | Zagar et al. ................. 365/149 |
| 5,742,549 A | | 4/1998 | Ochoa et al. ................ 365/201 |
| 5,790,459 A | | 8/1998 | Roohparvar ............ 365/185.21 |
| 5,835,433 A | | 11/1998 | Casper ........................ 365/207 |
| 5,870,338 A | * | 2/1999 | Casper .................... 365/189.01 |
| 5,903,502 A | | 5/1999 | Porter ......................... 365/201 |
| 5,930,188 A | | 7/1999 | Roohparvar ................ 365/201 |
| 5,949,730 A | | 9/1999 | Shirley et al. ............... 365/207 |
| 5,959,921 A | | 9/1999 | Manning et al. ............ 365/208 |
| 5,986,955 A | | 11/1999 | Siek et al. ................... 365/203 |
| 5,991,904 A | | 11/1999 | Duesman ..................... 714/720 |
| 6,005,816 A | | 12/1999 | Manning et al. ............ 365/208 |
| 6,075,737 A | | 6/2000 | Mullarkey et al. .......... 365/207 |
| 6,137,737 A | | 10/2000 | Mullarkey et al. .......... 365/201 |
| 6,157,566 A | | 12/2000 | Wu et al. .................... 365/175 |
| 6,169,695 B1 | | 1/2001 | Duesman ..................... 365/201 |
| 6,266,287 B1 | | 7/2001 | Porter ......................... 365/205 |
| 6,269,037 B1 | | 7/2001 | Porter ......................... 365/201 |
| 6,278,632 B1 | | 8/2001 | Chevallier .............. 365/185.03 |
| 6,292,417 B1 | | 9/2001 | Seyyedy ...................... 365/203 |
| 6,307,405 B2 | | 10/2001 | Forbes et al. ................. 327/54 |
| 6,345,006 B1 | | 2/2002 | Ingalls et al. ................ 365/205 |

* cited by examiner

Primary Examiner—Huan Hoang
(74) Attorney, Agent, or Firm—Schwegman, Lundberg, Woessner & Kluth, P.A.

(57) ABSTRACT

A sense amplifier circuit includes first and second amplifier circuits. The first amplifier circuit includes a pair of cross-coupled transistors of a first channel type (e.g., N-channel FETs), and the second amplifier circuit includes a pair of cross-coupled transistors of a second channel type (e.g., P-channel FETs). The sense amplifier circuit also includes a third transistor of the second channel type coupled between first nodes of the first and second amplifier circuits, and a fourth transistor of the second channel type coupled between second nodes of the first and second amplifier circuits. The sense amplifier circuit reduces access device leakage of a DRAM cell during LRL refresh access, and improves refresh margin on a DRAM cell with a one written thereto. A method of reducing access device leakage and improving refresh margin using such an improved sense amplifier is also described.

66 Claims, 11 Drawing Sheets

SENSE AMPLIFIER FOR REDUCTION OF ACCESS DEVICE LEAKAGE

FIELD OF THE INVENTION

The present invention relates to the field of semiconductor memory devices. More particularly, this invention relates to a memory device which includes a sense amplifier circuit that reduces access device leakage during active refresh.

BACKGROUND OF THE INVENTION

Semiconductor memory devices, such as dynamic random access memory (DRAM) devices, typically store data in an array of memory cells. Each cell in the array stores a single bit of data (i.e., a logic one or zero) as a charge on a capacitor. For example, referring to FIG. 1, a DRAM memory cell or memory bit 100 consists of one MOS transistor 102 and one storage capacitor 104—accordingly referred to as a one-transistor one-capacitor (1T1C) cell. Memory bit transistor 102 operates as a switch, interposed between the memory bit capacitor 104 and a digit or bit line 106. Memory bit 100 is capable of holding a single piece of binary information as stored electric charge in capacitor 104. Given a bias voltage of Vcc/2 on capacitor 104's common node, a logic one level is represented by +Vcc/2 volts across the capacitor, and a logic zero is represented by −Vcc/2 volts across the cell capacitor. Thus, the potential at node 110 typically equals Vcc for logic one, and ground for logic zero.

Digit line 106 consists of a conductive trace or line connected to a multitude of memory bit transistors for a multitude of memory cells in an array. Generally, either metal or silicided/polycided polysilicon forms the conductive line. Due to the large quantity of attached memory bits, its physical length, and its proximity to other features, digit line 106 is very capacitive. For instance, a typical value for digit line capacitance on a 0.35 µm process might be around 300 fF. Digit line capacitance is an important parameter since it dictates many other aspects of the memory design.

Memory bit transistor 102's gate terminal connects to a word line (row line) 108. Word line 108, which also connects to a multitude of memory bits or memory cells, consists of an extended segment of the same polysilicon that is used to form the transistor 102's gate. Word line 108 is formed so as to be physically orthogonal to digit line 106. A memory array 200, as in FIG. 2, is created by tiling a selected quantity of memory bits 100 together so that memory bits 100 along a given digit line 106 do not share a common word line 108, and bits 100 along a common word line 108 do not share a common digit line 106. In the layout of FIG. 2, memory bits are paired to share a common contact to the digit line, which reduces the array size.

Referring to FIG. 2, assume that the cell capacitors have logic one levels (+Vcc/2) stored on them. The digit lines D0, D1 . . . DN and D0*, D1* . . . DN* are initially equilibrated at Vcc/2 volts. All word lines WL0, WL1 . . . WLM are initially at 0 volts, which turns off the memory bit transistors. To read memory bit 1, word line WL0 transitions to a voltage that is at least one voltage threshold $V_{th}$ above Vcc. This elevated word line voltage level is referred to as Vccp or Vpp. When the word line voltage exceeds one $V_{th}$ above the digit line voltage (Vcc/2 in this example) and the memory bit transistor turns on, the memory bit capacitor will begin to discharge onto the digit line. Essentially, reading or accessing a DRAM cell results in charge sharing between the memory bit capacitor and the digit line capacitance. This sharing of charge causes the digit line voltage to either increase for a stored logic one or decrease for a stored logic zero. A differential voltage (Vsignal) develops between the two digit lines. The magnitude of this signal voltage Vsignal is a function of the memory bit capacitance (Cmemory_bit), digit line capacitance (Cdigit), the memory bit's stored voltage prior to the access (Vcell), and any noise terms Vnoise. For a design in which Vcell=1.65 V, Cmemory_bit=40 fF, Cdigit=300 fF and Vnoise=0, this yields a digit line change of Vsignal=194 mV. FIG. 3 provides a graph 300 with waveforms for the cell access operation just described.

After the cell access is complete, a sensing operation can commence. The reason for forming a digit line pair will now become apparent. FIG. 4 contains a schematic diagram for a simplified typical sense amplifier circuit 400. Circuit 400 consists of a cross-coupled NMOS transistor pair 402 forming an N-sense amplifier, and a cross-coupled PMOS transistor pair 404 forming a P-sense amplifier. The N-sense-amp common node is labeled NLAT* (for N-sense-amp LATch). Similarly, the P-sense-amp common node is labeled ACT (for ACTive pull-up). As shown in FIG. 5, NLAT* is biased to Vcc/2 volts and ACT is biased to Vss or ground. Since the digit line pair D0 and D0* are both initially at Vcc/2 volts, the N-sense-amp transistors are initially off due to zero Vgs potential. Similarly, both P-sense-amp transistors are initially off due to their positive Vgs potential. As discussed in the preceding paragraph, a signal voltage develops between the digit line pair D0 and D0* when the memory bit access occurs. While one digit line (D0) contains charge from the cell access, the other digit line (D0*) serves as a reference for the sensing operation. The sense amplifier firing generally occurs sequentially rather than concurrently. The N-sense-amp fires first and the P-sense-amp fires second. The N-sense amplifier is generally a better amplifier than the P-sense-amp because of the higher drive of NMOS transistors, and better $V_{th}$ matching. This provides for better sensing characteristics and lower probability of errors. Dropping the NLAT* signal toward ground will fire the N-sense-amp. As the voltage between NLAT* and the digit line approaches $V_{th}$, the N-sense-amp transistor whose gate connection is to the higher voltage digit line will begin to conduct first. This conduction results in the discharge of the low voltage digit line toward the NLAT* voltage. Ultimately, the NLAT* voltage will reach ground, bringing the low voltage digit line with it. The other NMOS transistor of the N-sense-amp will not conduct since its gate voltage derives from the low voltage digit line, which is being discharged toward ground.

Shortly after the N-sense-amp fires, ACT will be driven toward Vcc volts. This activates the P-sense-amp that operates in a complementary fashion to the N-sense-amp. With the low voltage digit line approaching ground, a strong signal will exist to drive the appropriate PMOS transistor into conduction. This will charge the high voltage digit line toward ACT, ultimately reaching Vcc. Since the memory bit transistor 102 remains on during sensing, the memory bit capacitor 104 is charged to the NLAT* voltage level (for a stored logic zero) or the ACT voltage level (for a stored logic one). Thus, the voltage, and hence the charge, which the memory bit capacitor held prior to accessing will be restored to a full level. In other words, capacitor 104 will be charged to Vcc for logic one and ground for logic zero. This restoration of the charge on capacitor 104 can be referred to as a refresh operation.

For a memory write operation, the paired digit lines are charged to represent the data to be written into the memory cell. Referring back to FIG. 1, the word line 108 is activated to turn on the memory bit transistor 102 to connect the digit line 106 to the memory cell capacitor 104, thereby allowing write data on D0/D0* to charge the cell capacitor. It will be appreciated that the memory read/write operations have been described herein in a simplified manner and that such access operations include numerous additional steps known to those skilled in the art.

As illustrated by FIG. 5, when the memory bit being accessed stores a logic one, the low voltage digit line D0* will be discharged toward the NLAT* voltage during a sensing operation. Similarly, when the memory bit being accessed stores a logic zero, the low voltage digit line D0 will be discharged toward NLAT*. Thus, in either case, the refresh operation will result in the low voltage digit line being discharged toward ground. Therefore, the "zero" seen on the low voltage digit line during the refresh access will have a potential of zero (i.e., ground potential). Such a memory refresh access may be referred to in the art as a LRL or active refresh access.

Unfortunately, allowing the "zero" seen on the low voltage digit line during a refresh access to be discharged all the way down to ground results in a relatively large access device leakage on all cells not being accessed but sharing the grounded digit, and adversely effects refresh margin on a DRAM cell with a one written thereto. Therefore, what is needed is an improved method and apparatus for reducing access device leakage of a DRAM memory cell during a LRL refresh access, and for improving refresh margin on a DRAM cell with a one written thereto. There is further a need for an improved sense amplifier for use in a DRAM memory circuit that reduces access device leakage, and improves refresh margin on a memory cell with a one written thereto. Preferably, such an improved sense amplifier would provide these advantages without adversely affecting its lock.

SUMMARY OF THE INVENTION

In accordance with one aspect of the invention, a sense amplifier circuit includes a first amplifier circuit and a second amplifier circuit, each having a first node and a second node. The first amplifier circuit includes a pair of cross-coupled transistors of a first channel type, and the second amplifier circuit includes a pair of cross-coupled transistors of a second channel type. The sense amplifier circuit also includes a third transistor of the second channel type coupled between the first node of the first amplifier circuit and the first node of the second amplifier circuit, and a fourth transistor of the second channel type coupled between the second node of the first amplifier circuit and the second node of the second amplifier circuit.

In accordance with another aspect of the present invention, a sense amplifier circuit includes an N-sense amplifier circuit and a P-sense amplifier circuit, each of which has first and second nodes, a first P-channel transistor coupled between the first node of the N-sense amplifier circuit and the first node of the P-sense amplifier circuit, and a second P-channel transistor coupled between the second node of the N-sense amplifier circuit and the second node of the P-sense amplifier circuit.

These and various other features as well as advantages which characterize the present invention will be apparent to a person of ordinary skill in the art upon reading the following detailed description and reviewing the associated drawings.

DESCRIPTION OF THE PREFERRED EMBODIMENTS

Figure 1:
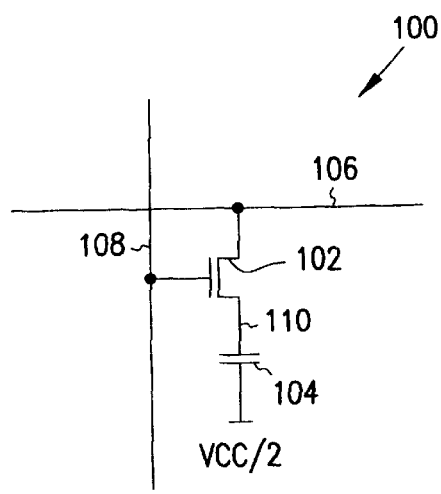
FIG. 1 is a schematic diagram of a cell of a conventional memory circuit.
Figure 2:
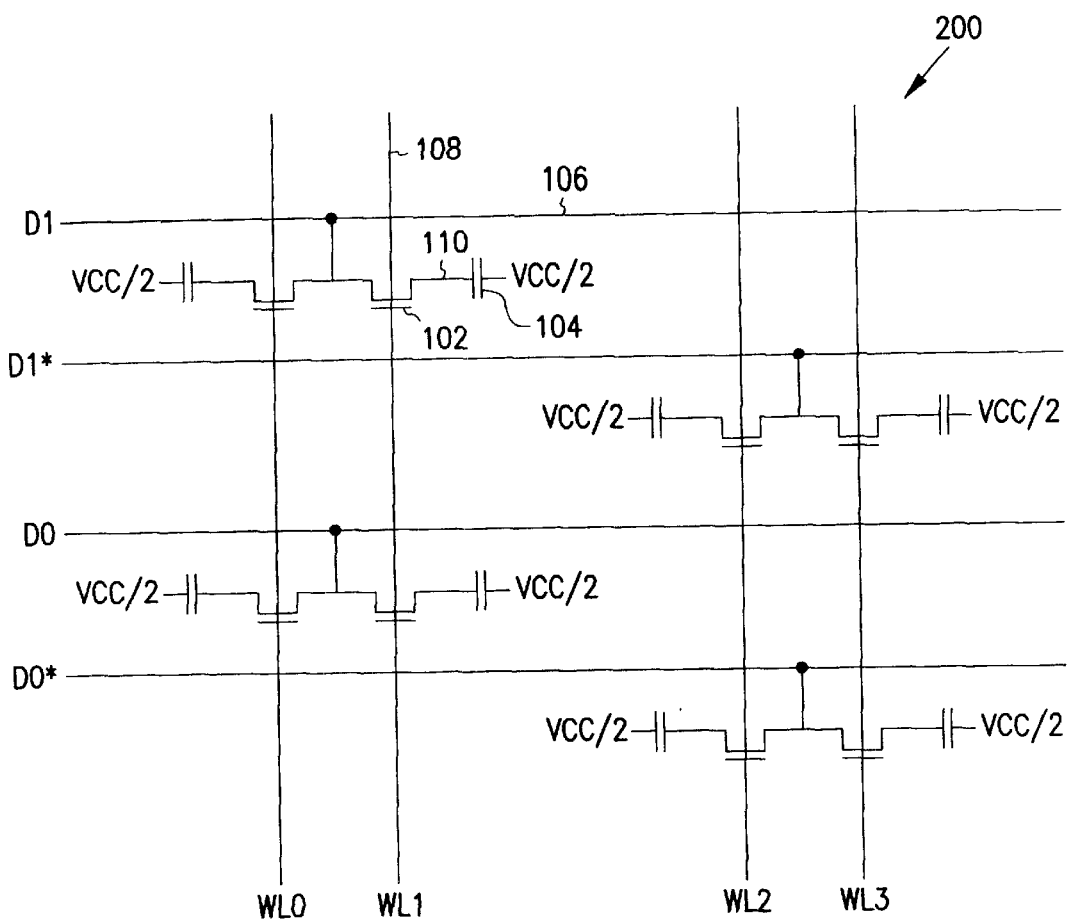
FIG. 2 is a schematic diagram of a conventional memory array including a plurality of memory cells, each memory cell having the structure shown in FIG. 1.
Figure 3:
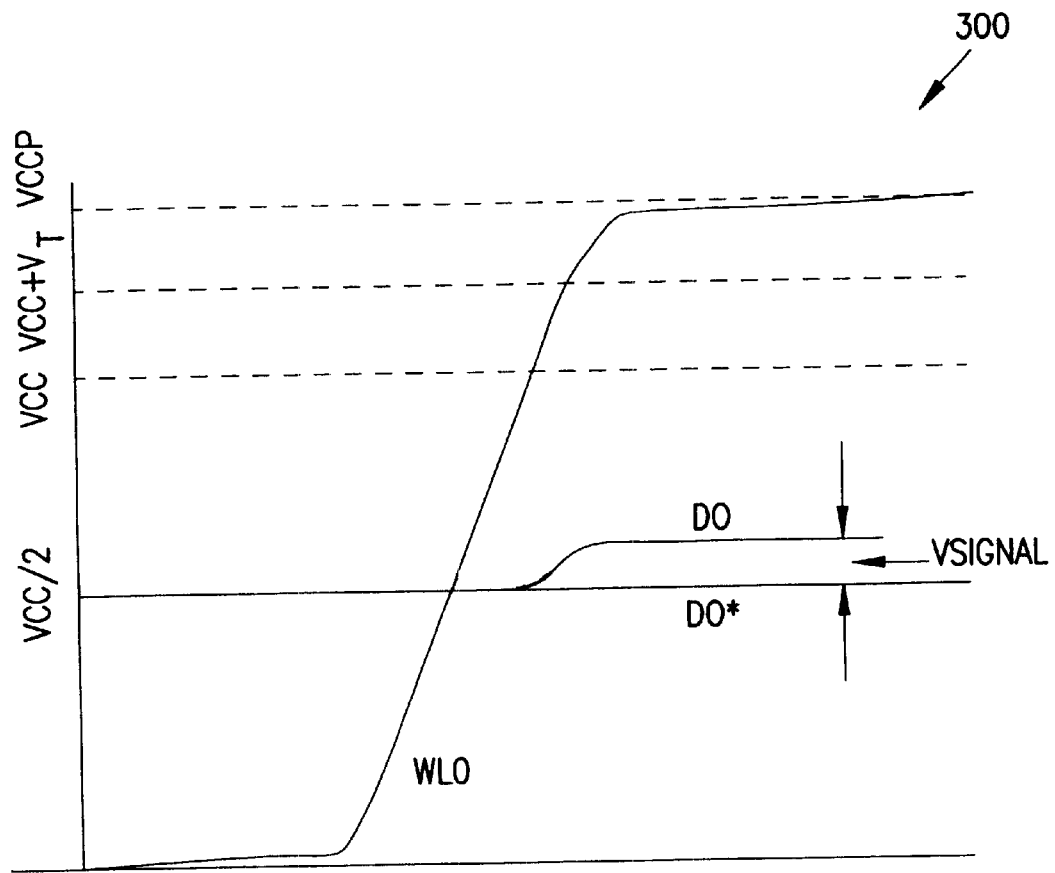
FIG. 3 is a graph illustrating typical waveforms for accessing a memory cell of the conventional memory array shown in FIG. 2 (e.g., during a read operation)
Figure 4:
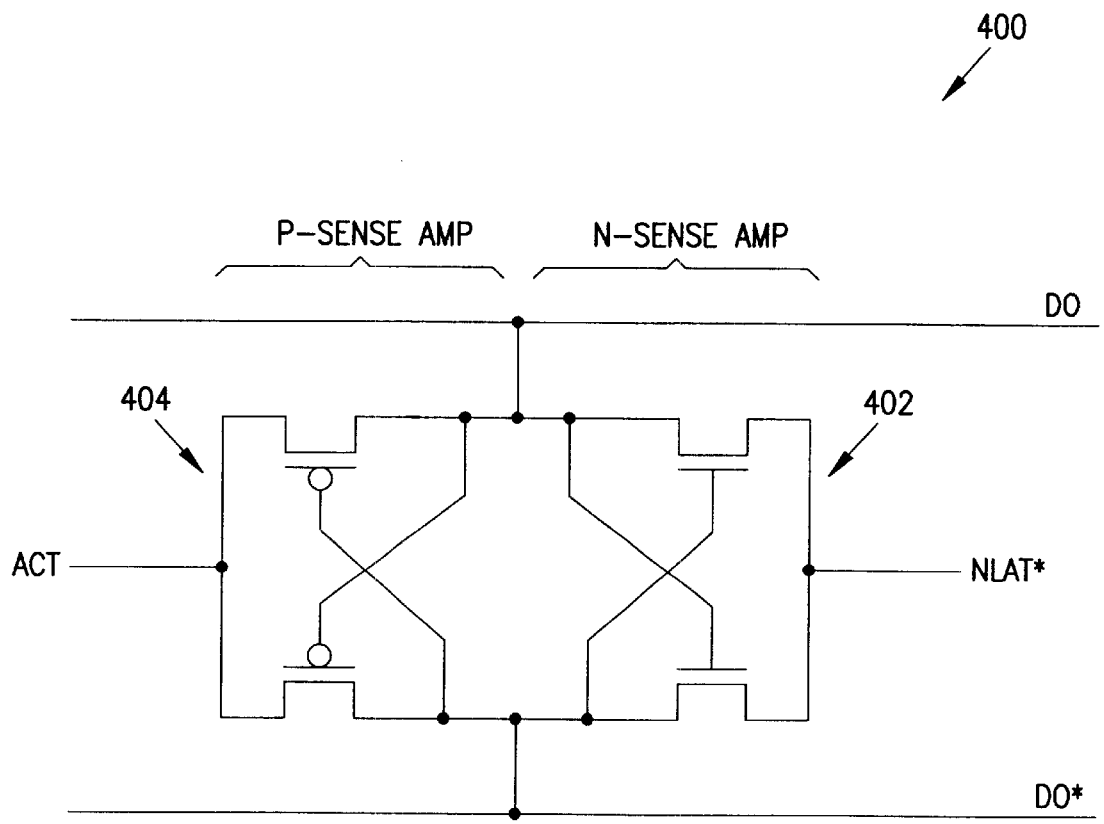
FIG. 4 is a schematic diagram of a conventional sense amplifier.
Figure 5:
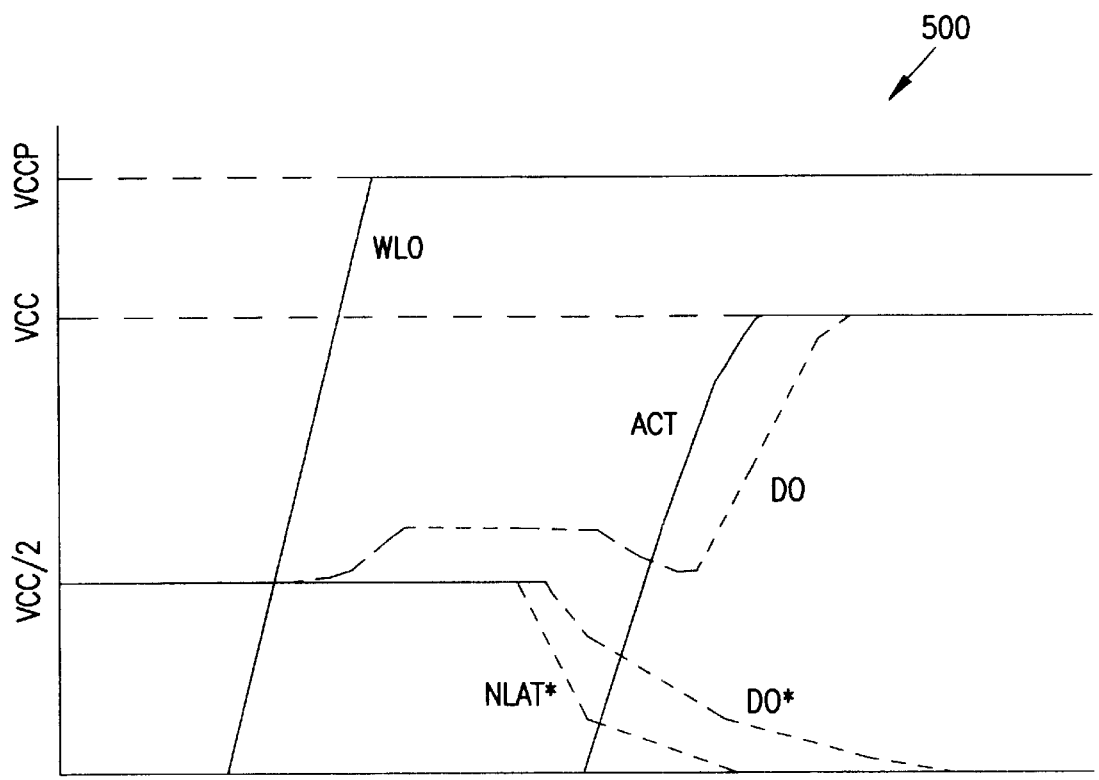
FIG. 5 is a graph illustrating typical waveforms for a sensing operation using the conventional sense amplifier shown in FIG. 4.

In the following detailed description, reference is made to the accompanying drawings, which form a part hereof, and in which is shown, by way of illustration, specific embodiments in which the invention may be practiced. In the drawings, like numerals refer to like components throughout the views. These embodiments are described in sufficient detail to enable those skilled in the art to practice the invention, and it is to be understood that the embodiments may be combined, or that other embodiments may be utilized and that structural, logical and electrical changes may be made without departing from the spirit and the scope of the invention. The following detailed description is, therefore, not to be taken in a limiting sense, and the scope of the invention is defined by the appended claims and their equivalents.

Figure 6:
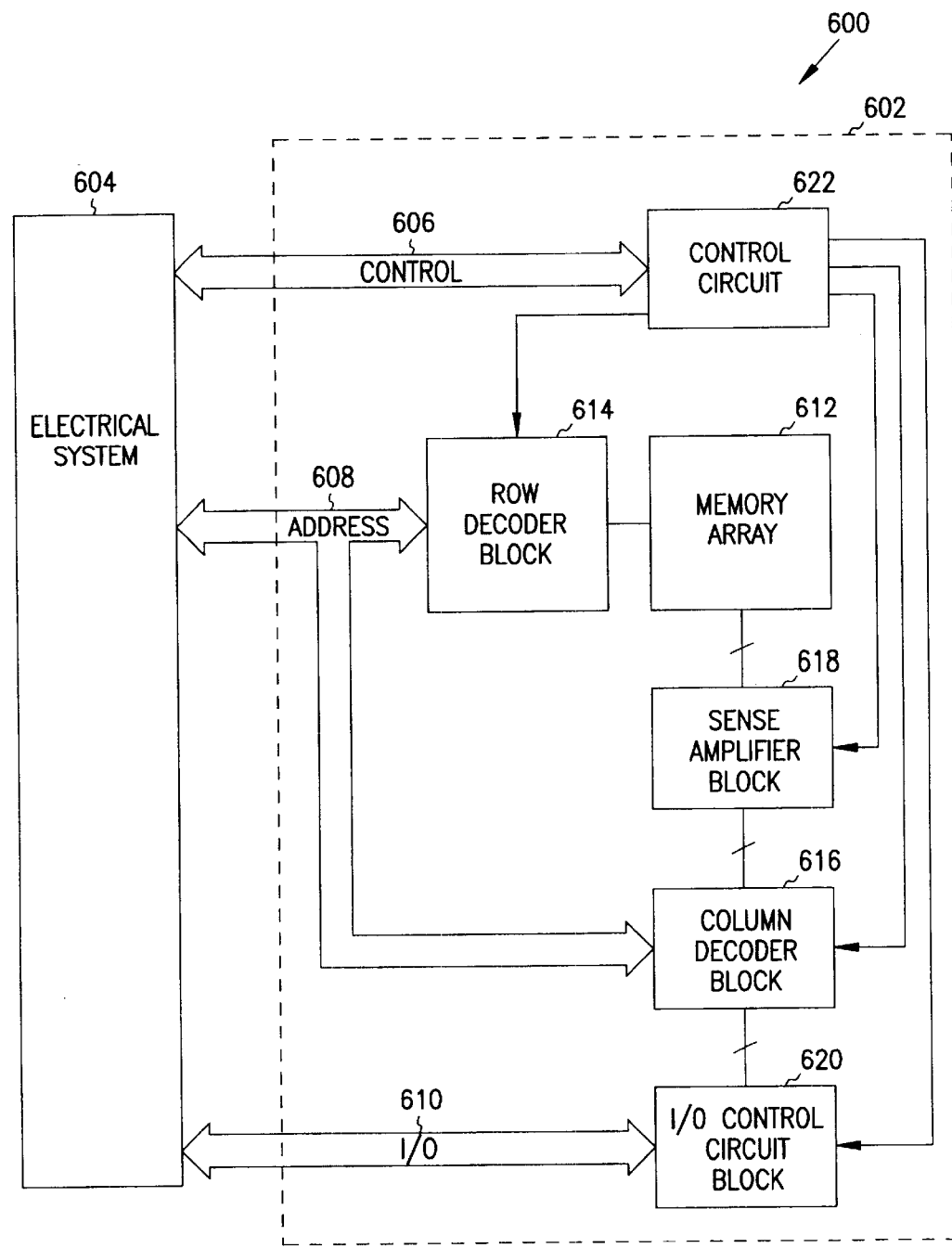
FIG. 6 is a block diagram illustrating a memory circuit in accordance with one embodiment of the present invention.

Referring to FIG. 6, an exemplary system 600 includes a memory circuit or device 602 in accordance with one embodiment of the present invention. Memory device 602 is coupled to an electrical system 604 by a plurality of control lines 606, a plurality of address lines 608, and a plurality of input/output (I/O) lines 610. By using lines 606, 608 and 610, electrical system 604 can write data to memory device 602, and can also read data from memory device 602. Memory device 602 includes a memory array 612, a row decoder block 614 coupled between address lines 608 and memory array 612, a column decoder block 616 coupled to address lines 608, a sense amplifier block 618 coupled between column decoder block 616 and memory array 612, an I/O control circuit block 620 coupled to I/O lines 610 and column decoder block 616, and a control circuit 622 coupled to row decoder block 614, column decoder block 616, sense amplifier block 618, and I/O control circuit 620.

Memory array 612 includes multiple rows of word (row) lines and multiple columns of bit (digit) lines. The intersections of the multiple rows of word lines and the multiple columns of bit lines serve as the locations for multiple memory cells. In one embodiment, memory array 612 forms a dynamic random access memory (DRAM) array. Further, in one embodiment, the memory cells of array 612 use a memory cell layout architecture of eight square features ($8F^2$). In an alternative embodiment, the memory cells use a layout architecture of six square features ($6F^2$). One of skill in the art will appreciate that other layout architectures are also suited for use with the invention; those presented here are not intended to be limiting.

Row decoder block 614 decodes the address signals provided by electrical system 604 on address lines 608 to generate a plurality of word (row) lines, which are applied to memory array 612 to access the memory cells of memory array 612. Similarly, column decoder block 616 decodes address signals provided on address lines 608 to select the bit (digit) lines that are being accessed. In one embodiment, memory device 602 uses multiplexed row and column addresses. The selected bit (digit) lines are used by sense amplifier block 618 to access the columns of memory cells in memory array 612. I/O control circuit block 620 and control circuit 622 provide control signals for controlling various operations of memory device 602.

Figure 7:
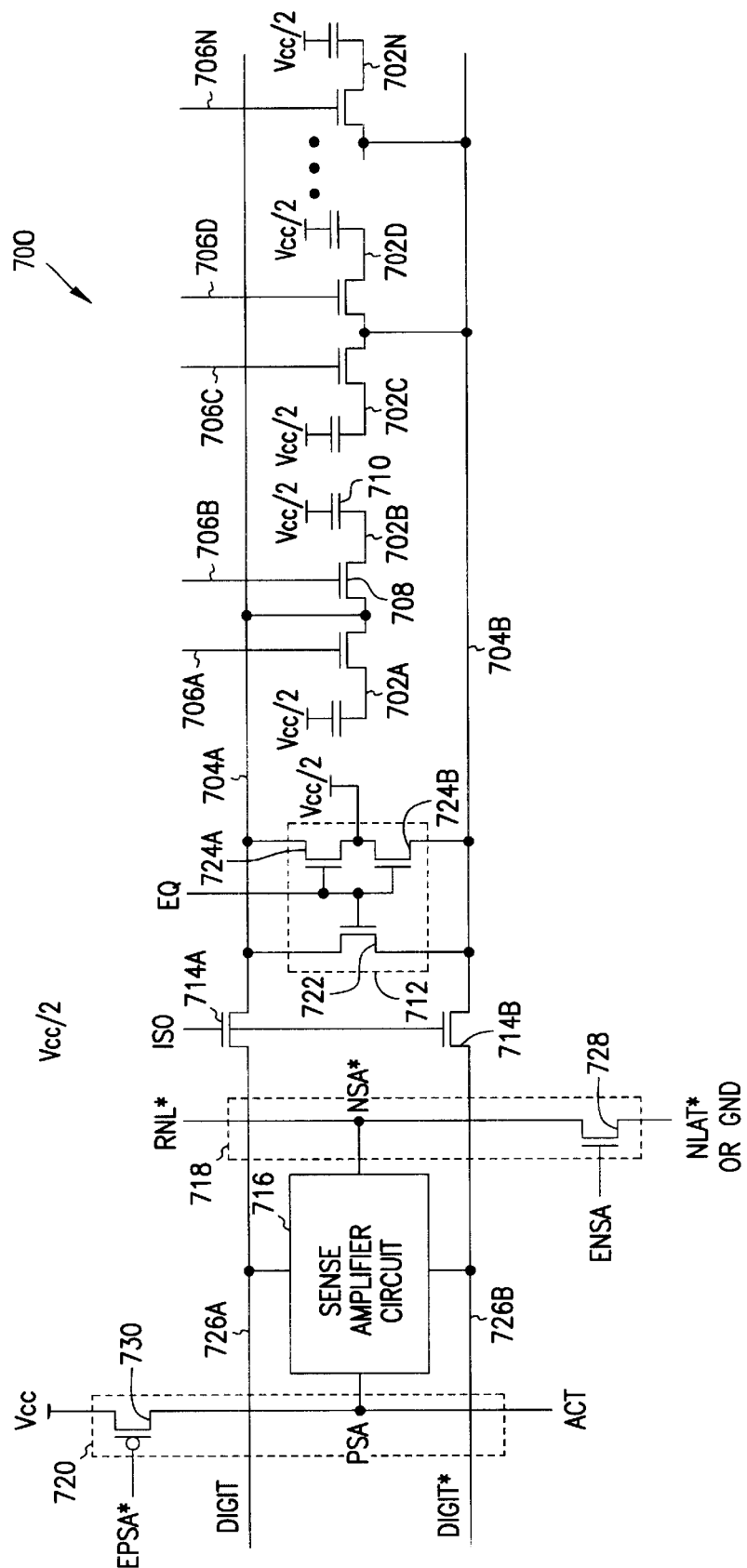
FIG. 7 is a schematic diagram illustrating in more detail a portion of the memory circuit shown in FIG. 6.

Referring now to FIG. 7, a schematic diagram 700 illustrates in more detail a portion of memory circuit 602 (FIG. 6), including portions of memory array 612 and sense amplifier block 618. The illustrated portions of array 612 include a plurality of memory cells 702A . . . 702N, which are coupled to a pair of complementary digit or bit lines 704A and 704B and to a plurality of word lines 706A . . . 706N. Each cell 702A . . . 702N includes a memory bit transistor 708 and a memory bit capacitor 710 (labeled for cell 702B only in FIG. 7). Hence, the memory cells can be referred to as one-transistor one-capacitor (1T1C) cells. Cells 702A . . . 702N are located at the intersections of digit lines 704A and 704B, and word lines 706A . . . 706N. For each cell, memory bit transistor 708 has a gate coupled to the respective word line 706A . . . 706N, a first source/drain coupled to the respective digit line 704A or 704B, and a second source/drain coupled to a first node of the respective cell capacitor 710. The other node of the cell capacitor 710 is coupled to a bias voltage (e.g., Vcc/2 volts). For each memory cell, a logic one is represented by +Vcc/2 across the respective capacitor 710, and a logic zero is represented by −Vcc/2 across the capacitor 710.

The illustrated portions of sense amplifier block 618 include an equilibration and bias circuit 712, a pair of isolation transistors 714A and 714B, a sense amplifier circuit 716, an N-sense firing circuit 718, and a P-sense firing circuit 720.

Equilibration and bias circuit 712 operates to provide the same voltage on the pair of digit lines 704A and 704B, which form a column pair, before starting a cell access and sensing operation. Circuit 712 includes an equilibration transistor 722 coupled between digit lines 704A and 704B, and two bias transistors 724A and 724B coupled between digit lines 704A and 704B, and Vcc/2. The gate of transistors 722, 724A and 724B are each coupled to an equilibrate control signal EQ. EQ is held to Vcc volts whenever memory device 602 is in an inactive or precharge state. During this time, the complementary pair of digit lines 704A and 704B are shorted together through equilibrate transistor 712, and are provided a bias level of Vcc/2 by transistors 724A and 724B. Then, just prior to any word line firing, EQ transitions low to turn off the equilibration and bias transistors 722, 724A and 724B, such that digit lines 704A and 704B are made available for accessing the memory cell. In one embodiment, equilibration and bias transistors 722, 724A and 724B are all NMOS transistors sized large enough to ensure rapid equilibration of the digit lines, and to ensure bias of the digit lines to Vcc/2, to prepare for a subsequent access. Thus, equilibration and bias circuit 712 operates to eliminate adverse effects on the signal voltage that may otherwise be due to offset voltage on digit lines 704A and 704B.

Isolation transistors 714A and 714B are coupled between digit lines 704A and 704B and a complementary pair of digit lines 726A and 726B, respectively, that serve as the DIGIT and DIGIT* input signals for sense amplifier circuit 716. By providing resistance between sense amplifier circuit 716 and digit lines 704A and 704B, isolation transistors 714A and 714B operate to stabilize the sense amplifier and to speed up sensing operations by providing a degree of isolation between the highly-capacitive digit lines 704A and 704B and the low-capacitance sense nodes. In one embodiment, isolation transistors 714A and 714B also operate to isolate array sections to allow a single sense amplifier to serve two adjacent array sections.

N-sense firing circuit 718 includes an enable N-sense amplifier (ENSA) transistor 728 that couples an N-sense amplifier latch signal (e.g., NLAT* or ground) to an N-sense amplifier bus line (RNL*) under the control of an ENSA signal that is applied to its gate. RNL* serves as N-sense-amp firing control signal NSA* for sense amplifier circuit 716. Similarly, P-sense firing circuit 720 includes an enable P-sense amplifier (EPSA) transistor 730 that couples a P-sense amplifier active pull-up signal (ACT) to the P-sense-amp firing control signal (PSA) for sense amplifier circuit 716 under the control of an EPSA* signal applied to its gate. In this embodiment, ACT and PSA are the same node.

Figure 8:
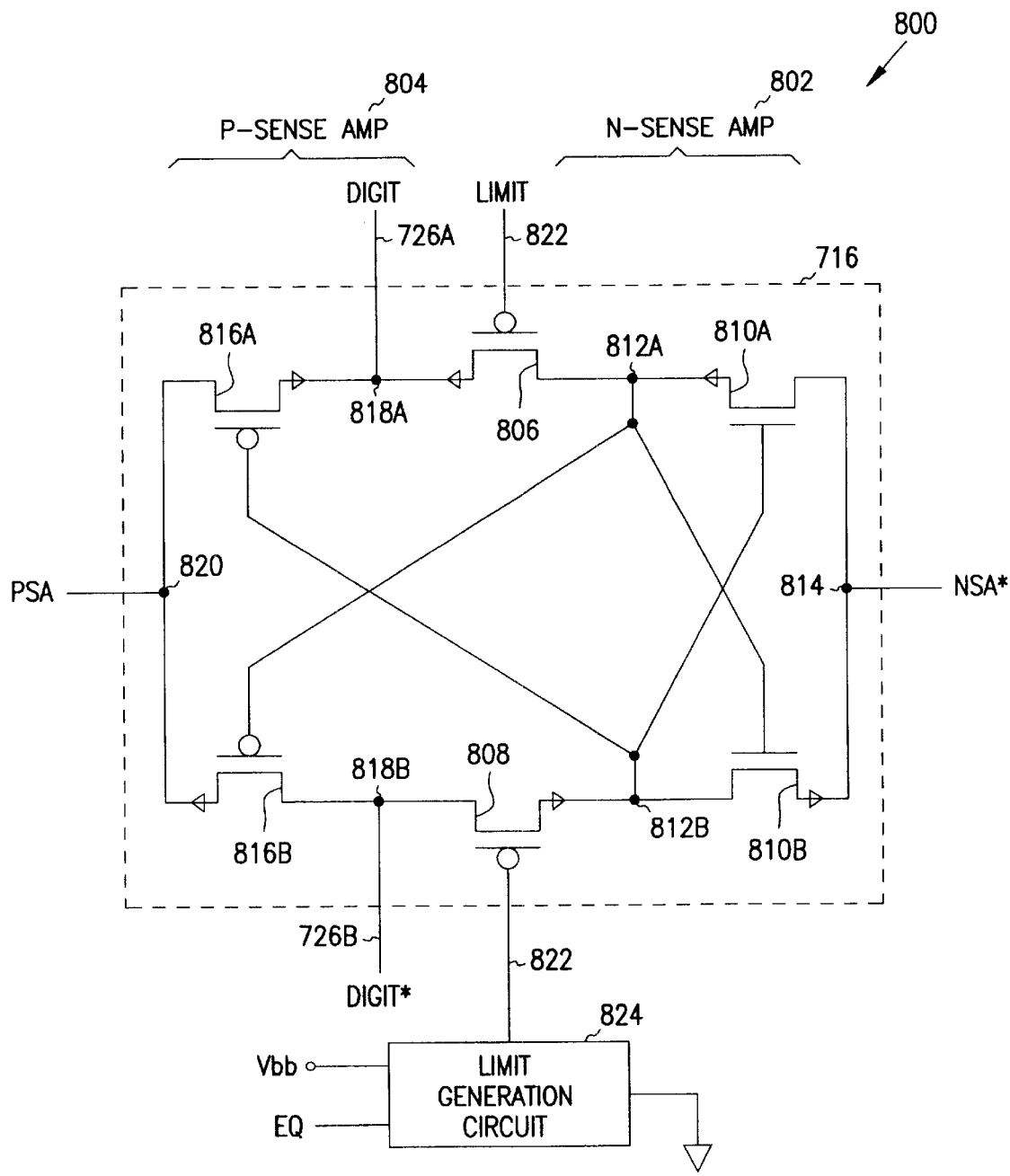
FIG. 8 is a schematic diagram of the sense amplifier of FIG. 7.

Referring to FIG. 8, a schematic diagram 800 illustrates sense amplifier circuit 716 in detail. Circuit 716 includes an N-sense amplifier circuit 802, a P-sense amplifier circuit 804, a P-channel transistor 806, and a P-channel transistor 808.

N-sense amplifier circuit 802 comprises a pair of N-channel transistors 810A and 810B. N-channel transistors 810A and 810B are cross-coupled, with the gate node of transistor 810A coupled to a first source/drain node of transistor 810B, and the gate node of transistor 810B coupled to a first source/drain node of transistor 810A. The first source/drain node of transistor 810A and first source/drain node of transistor 810B define a first node 812A and a second node 812B of circuit 802. A second source/drain node of transistor 810A is coupled to a second source/drain node of transistor 810B to form a common node 814 for circuit 802. The common node 814 receives the NSA* signal generated by N-sense firing circuit 718 (FIG. 7).

P-sense amplifier circuit 804 comprises a pair of P-channel transistors 816A and 816B. P-channel transistors 816A and 816B are cross-coupled, with the gate node of transistor 816A coupled to second node 812B of N-sense amplifier circuit 802, and the gate node of transistor 816B coupled to first node 812A of N-sense amplifier circuit 802. A first source/drain node of transistor 816A and a first source/drain node of transistor 816B define a first node 818A and a second node 818B of P-sense amplifier circuit 804. The first and second nodes 818A and 818B of the P-sense amplifier circuit 804 are coupled to the pair of complementary digit lines DIGIT and DIGIT* via lines 726A and 726B (FIGS. 7 and 8). A second source/drain node of transistor 816A is coupled to a second source/drain node of transistor 816B to form a common node 820 for P-sense amplifier circuit 804. The common node 820 receives the PSA signal that is generated by P-sense firing circuit 720 (FIG. 7).

P-channel transistor 806 includes a first source/drain node coupled to first node 812A of N-sense amplifier circuit 802, a second source/drain node coupled to first node 818A of P-sense amplifier circuit 804, and a gate node coupled to a limit signal (LIMIT) via a line 822. Similarly, P-channel transistor 808 includes a first source/drain node coupled to second node 812B of N-sense amplifier circuit 802, a second source/drain node coupled to second node 818B of P-sense amplifier circuit 804, and a gate node which is also coupled to limit signal (LIMIT) via line 822.

The LIMIT signal on line 822 is generated by a limit generation circuit 824. During access and sense operations, circuit 824 holds the LIMIT signal at ground to pass a P-channel voltage threshold $V_{th}$ to the low voltage digit line, as described in relation to FIG. 9. The P-channel voltage threshold $V_{th}$ limits the "zero" that is seen on the low voltage digit line during an LRL refresh access to a voltage greater than zero. By limiting the zero to a voltage greater than zero, refresh margin on a DRAM cell with a one written thereto is improved by reducing access device leakage. At equilibrate time (which, in one embodiment, is indicated by the EQ signal shown in FIG. 8), limit generation circuit 824 drives the LIMIT signal to a negative substrate bias voltage Vbb. In one embodiment, voltage Vbb is generated by a Vbb pump. By driving the LIMIT signal to Vbb during equilibrate, the low voltage digit line is driven to NSA* rather than the one P-channel $V_{th}$ to allow for a balanced equilibrate.

Figure 9:
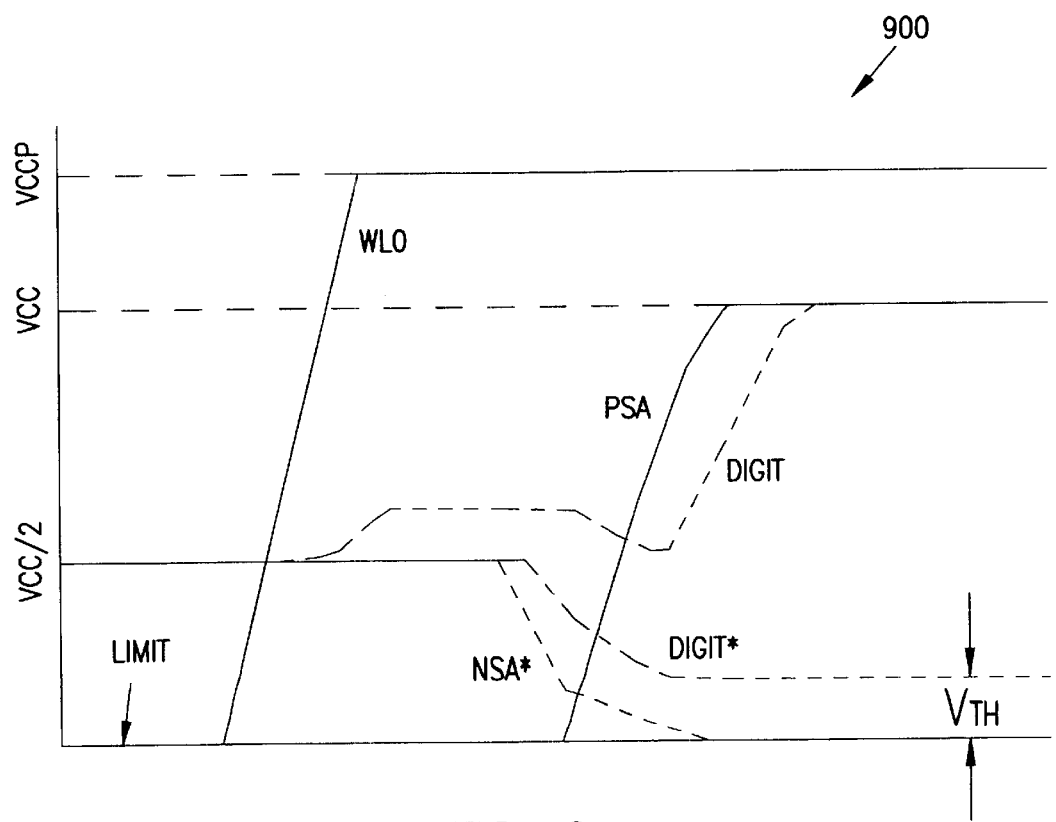
FIG. 9 is a graph illustrating typical waveforms for a sensing operation using the sense amplifier shown in FIG. 8.

Referring to FIG. 9, operation of sense amplifier circuit 716 during an access and sense operation on a memory cell is described in relation to a graph 900. Shown in graph 900 are waveforms including the word line signal WL0 for the cell, the pair of complementary digit lines DIGIT and DIGIT*, the NSA* signal from the N-sense firing circuit, the PSA signal from the P-sense firing circuit, and the LIMIT signal. The LIMIT signal is held at ground during the access and sense operation. In the exemplary operation of FIG. 9, it is assumed that the memory cell stores a logic one.

Initially, the NSA* signal is biased to Vcc/2, and the PSA signal is biased to Vss or signal ground. The digit line pair DIGIT and DIGIT* are equilibrated and are biased to Vcc/2. As a result, both N-sense amplifier transistors 810A and 810B are off. Similarly, both P-sense amplifier transistors 816A and 816B are off. Since the LIMIT signal is held at ground, both P-channel transistors 806 and 808 are on. Since the word line WL0 for the memory cell is initially at 0 volts, the cell transistor 708 is off, and the cell capacitor 710 does not share its charge with the DIGIT line.

Then, the word line WL0 (i.e., one of lines 706A . . . 706N) for the memory cell being accessed is fired. When the word line WL0 reaches a voltage at least one voltage threshold $V_{th}$ above Vcc, the memory cell transistor 708 turns on, and the memory cell capacitor 710 begins to discharge onto the digit line DIGIT. Since the cell is assumed to be storing a logic one, the voltage initially applied to the digit line by the cell capacitor is Vcc. The charge sharing between the memory cell capacitor and the digit line causes the DIGIT line voltage to increase. (If, on the other hand, the memory cell were storing a logic zero, the DIGIT line voltage would decrease.) The increase in the DIGIT line voltage above the bias voltage causes a differential voltage signal to be developed across the pair of complementary digit lines. Thus, while one of the digit lines shares charge with the memory cell being accessed, the other digit line does not—and thereby serves as a reference for the sensing operation.

In one embodiment, after the cell access is complete, the N-sense amplifier circuit 802 and P-sense amplifier circuit 804 are fired sequentially, with the N-sense amplifier circuit being fired before the P-sense amplifier circuit. The higher drive of NMOS transistors, and better $V_{th}$ matching, provide better sensing characteristics by N-sense amplifiers and lower probability of errors, compared to P-sense amplifiers. At this point, the voltages at first and second nodes 812A and 812B of the N-sense amplifier circuit follow the voltages of the DIGIT and DIGIT* lines, respectively, since both of the first and second P-channel transistors 806 and 808 are still on.

As shown in FIG. 9, N-sense amplifier circuit 802 is fired by bringing NSA* from cc/2 toward ground. As the voltage difference between NSA* and the digit lines approaches $V_{th}$, the transistor 810A or 810B in the cross-coupled NMOS pair whose gate is connected to the higher voltage digit line begins to conduct. This conduction occurs first in the sub-threshold region and then in the saturation region as the gate-to-source voltage exceeds $V_{th}$. In this example, since DIGIT is the higher voltage digit line, NMOS transistor 810B begins to conduct. The conduction causes the low voltage digit line (i.e., DIGIT*, in this example) and the second node 812B of N-sense amplifier circuit 802 to be discharged toward the NSA* voltage, which is being brought toward ground. Ultimately, NSA* will reach ground, and the second node 812B of N-sense amplifier circuit 802 will be brought to ground potential. The other NMOS transistor 810A, however, does not conduct since its gate is driven by second node 812B of circuit 802, which is being discharged toward ground. In reality, parasitic coupling between digit lines and limited subthreshold conduction by the second transistor results in some conduction in voltage on the high digit line.

As the voltage difference between the LIMIT signal (which is being held at ground potential) and the NSA* signal reaches the P-channel threshold voltage $V_{th}$ of transistor 808, however, P-channel transistor 808 will turn off. Thus, a P-channel threshold voltage $V_{th}$ is passed to low voltage digit line DIGIT*, thereby limiting the "zero" seen on the low voltage digit line DIGIT* to something greater than zero (i.e., to NSA*, which is brought to ground, plus a P-channel voltage threshold $V_{th}$). The effect on the low voltage digit line DIGIT* is illustrated in FIG. 9, which shows that the DIGIT* line decreases with NSA* until reaching a minimum voltage of $V_{th}$.

Some time after N-sense amplifier circuit 802 fires, PSA is brought toward Vcc to fire P-sense amplifier circuit 804, which operates in a complementary fashion to the N-sense amplifier. With second node 812B of N-sense amplifier circuit 802 approaching ground, there is a strong signal to drive the appropriate PMOS transistor (816A, in this example) in the cross-coupled PMOS pair into conduction. This conduction, again moving from subthreshold to saturation, charges the high-voltage digit line DIGIT toward PSA, ultimately reaching Vcc. Note that P-channel transistor 806 remains on, such that first node 812A of N-sense amplifier circuit 802 continues to follow the high-voltage digit line DIGIT. Because the memory cell transistor 708 remains on, the memory cell capacitor 710 is refreshed during the sensing operation. The voltage, and hence charge, which the memory cell capacitor held prior to being accessed is restored to a full level (e.g., to Vcc in this example).

Thus, as shown in FIG. 9, the "zero" that is seen on the low-voltage digit line during an LRL refresh access is limited to something greater than zero volts (e.g., to NSA*, which is brought to ground, plus a P-channel voltage threshold $V_{th}$). At the same time, sense amplifier circuit 716 is allowed to keep its lock (without adverse effect due to P-channel transistors 806 and 808) since the gates of the P- and N-channel transistors of the sense amplifier circuits 802 and 804 remain at CMOS levels (i.e., since the cross-coupled gate connections are all made between N-sense amplifier circuit 802 and the pair of P-channel transistors 806 and 808). By limiting the "zero" seen on the low-voltage digit line, access device leakage can be reduced on a memory cell sharing the low digit but with its word line off, thereby improving refresh margin on a DRAM cell with a one written thereto.

Figure 10:
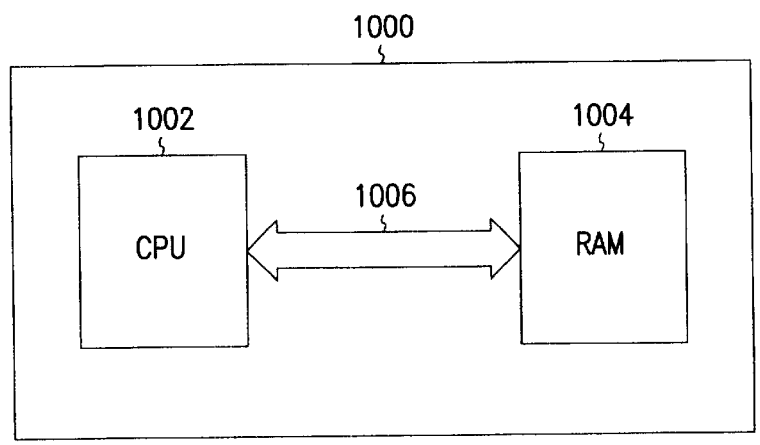
FIG. 10 is a block diagram illustrating an electronic system in accordance with an embodiment of the present invention.

Referring to FIG. 10, an electronic system 1000 in accordance with one embodiment of the present invention includes a central processing unit (CPU) 1002 which is communicatively coupled to a memory device 1004 via a system bus 1006. Memory device 1004 includes memory circuit 602, presented and described above in relation to FIG. 6, and which includes one or more sense amplifiers in accordance with an embodiment of the present invention. In other embodiments, CPU 1002 is communicatively coupled to a plurality of memory devices 1004 via bus 1006.

Figure 11:
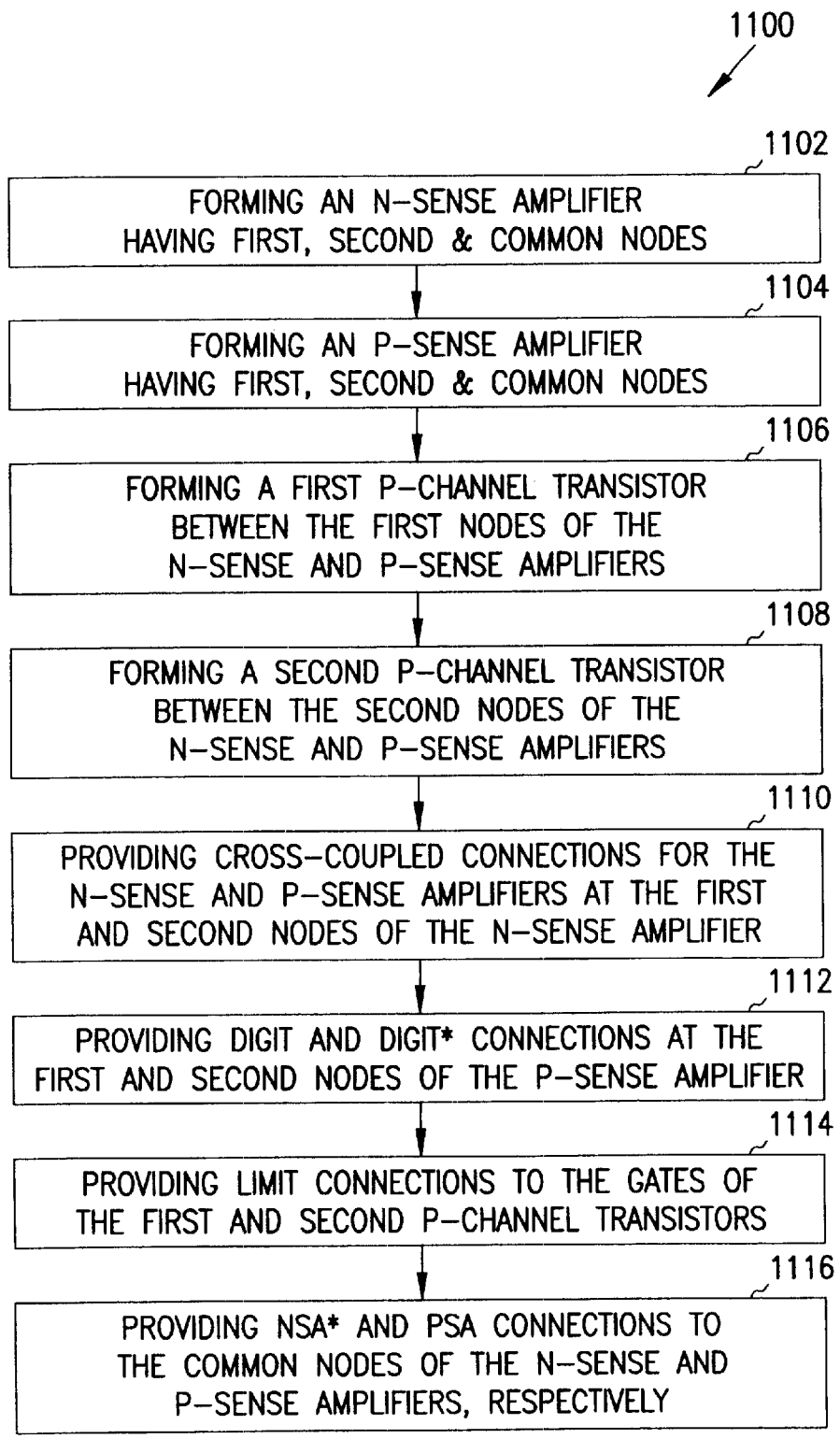
FIG. 11 is a flow diagram illustrating a method of forming a sense amplifier in accordance with an embodiment of the present invention.

A method 1100 for forming a sense amplifier circuit in accordance with an embodiment of the present invention will be understood with reference to FIG. 11. Method 1100 includes forming an N-sense amplifier having first, second and common nodes at 1102, forming a P-sense amplifier having first, second and common nodes at 1104, forming a first P-channel transistor between the first nodes of the N-sense and P-sense amplifiers at 1106, and forming a second P-channel transistor between the second nodes of the N-sense and P-sense amplifiers at 1108. The N-sense amplifier may have the form, for example, of N-sense amplifier 802 (FIG. 8), with the first, second and common nodes being at nodes 812A, 812B and 814, respectively. The P-sense amplifier may have the form, for example, of P-sense amplifier 804, with the first, second and common nodes being at nodes 818A, 818B and 820, respectively. The first P-channel transistor may have the form, for example, of P-channel transistor 806, with a first source/drain region coupled to node 812A of N-sense amplifier 802, and a second source/drain region coupled to node 818A of P-sense amplifier 804. The second P-channel transistor may have the form, for example, of P-channel transistor 808, with a first source/drain region coupled to node 812B of N-sense amplifier 802, and a second source/drain region coupled to node 818B of P-sense amplifier 804.

Method 1100 also includes providing cross-coupled connections for the N-sense and P-sense amplifiers at the first and second nodes of the N-sense amplifier at 1110, providing DIGIT and DIGIT* connections at the first and second nodes of the P-sense amplifier at 1112, providing LIMIT connections to the gates of the first and second P-channel transistors at 1114 and providing NSA* and PSA connections to the common nodes of the N-sense and P-sense amplifiers, respectively, at 1116. In one embodiment, the cross-coupled, DIGIT, DIGIT*, LIMIT, NSA* and PSA connections may be provided as illustrated in FIG. 8.

Figure 12:
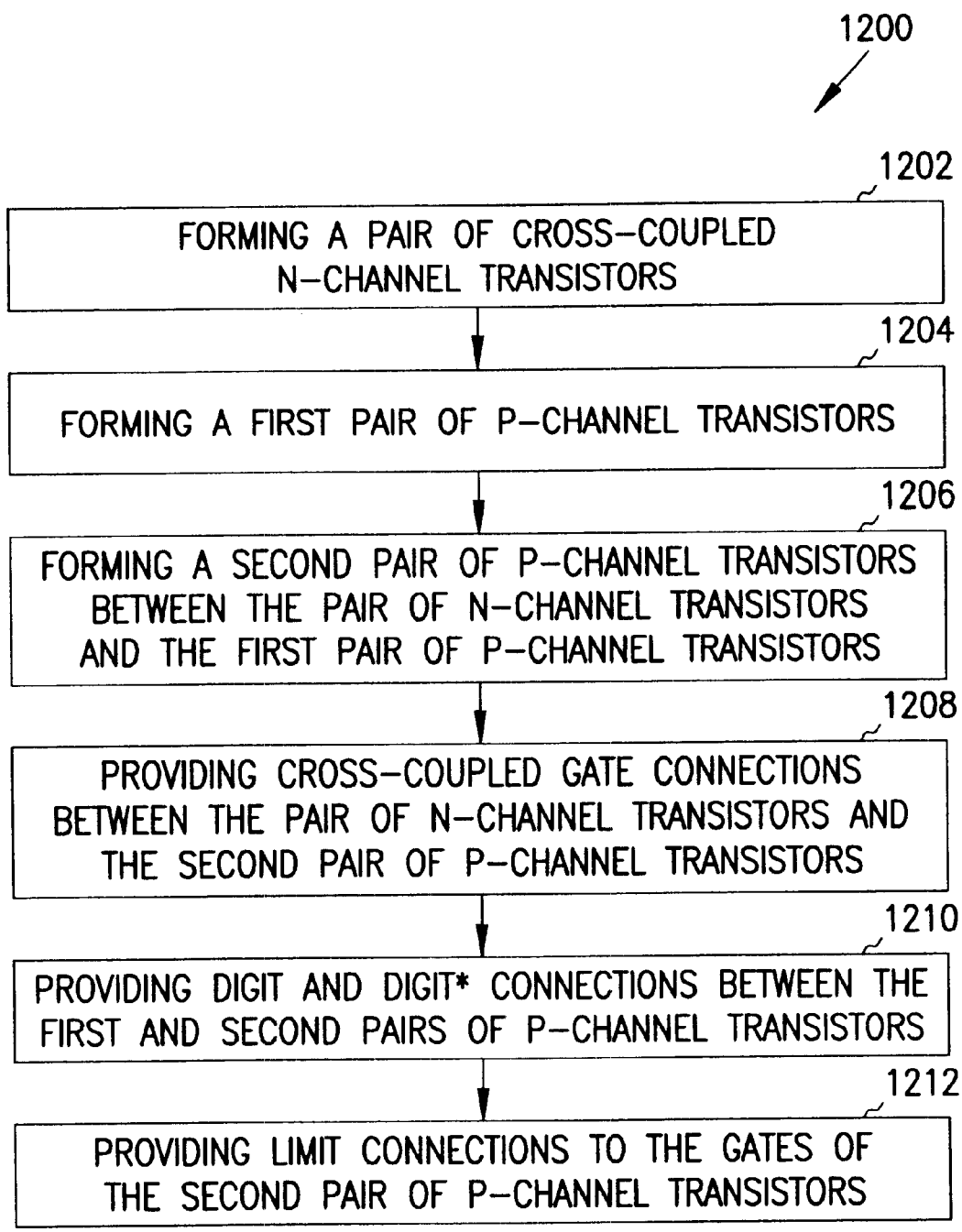
FIG. 12 is a flow diagram illustrating a method of forming a sense amplifier in accordance with another embodiment of the present invention.

Referring to FIG. 12, a method 1200 for forming a sense amplifier circuit in accordance with another embodiment of the present invention includes forming a pair of cross-coupled N-channel transistors at 1202, forming a first pair of P-channel transistors at 1204, forming a second pair of P-channel transistors between the pair of N-channel transistors and the first pair of P-channel transistors at 1206, providing cross-coupled gate connections between the pair of N-channel transistors and second pair of P-channel transistors at 1208, providing DIGIT and DIGIT* connections between the first and second pairs of P-channel transistors at 1210, and providing LIMIT connections to the gates of the second pair of P-channel transistors at 1212.

Figure 13:
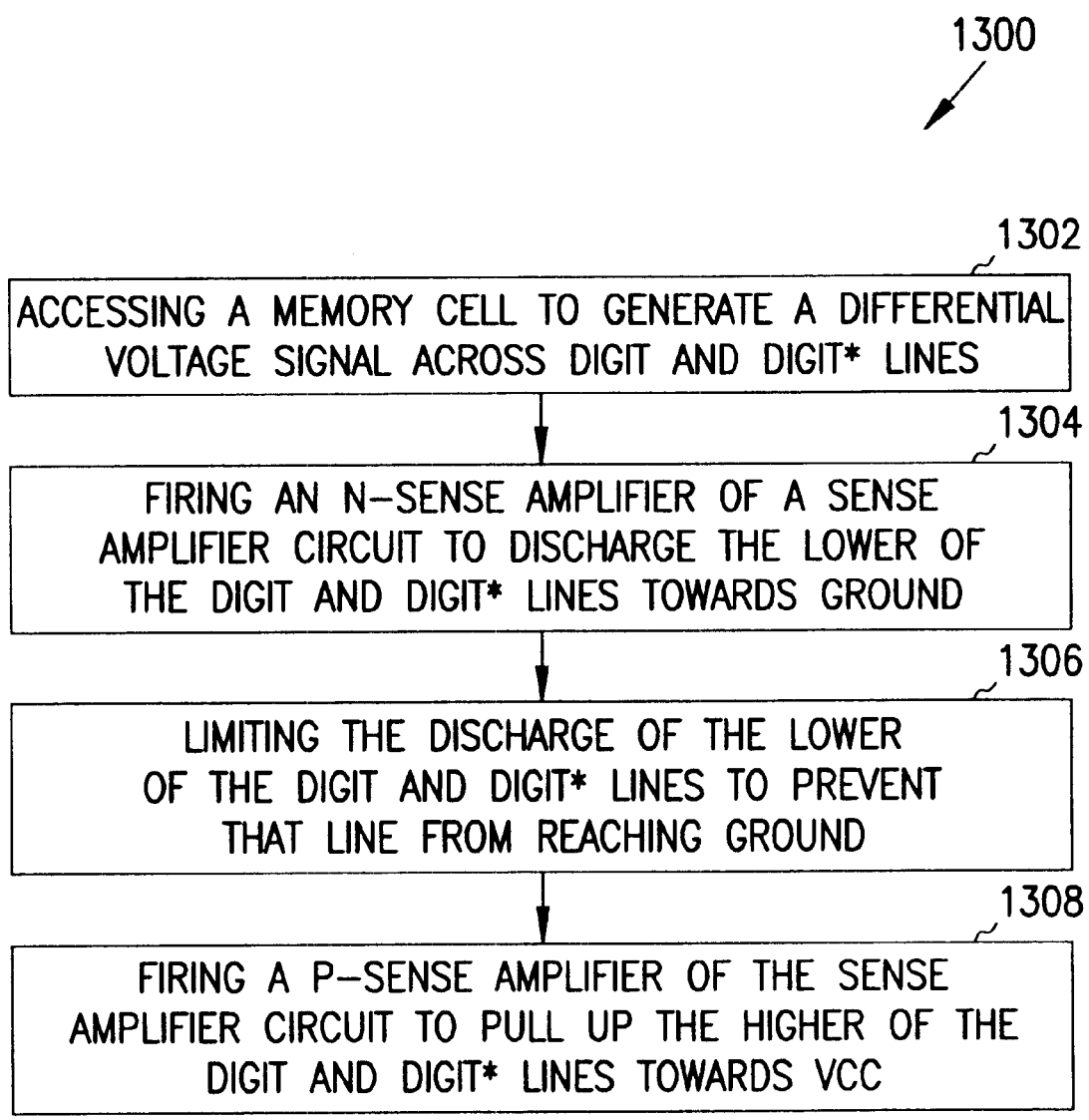
FIG. 13 is a flow diagram illustrating a method of sensing a memory cell in a memory circuit in accordance with one embodiment of the present invention.

Referring to FIG. 13, a method 1300 for sensing a memory cell in a memory circuit includes accessing a memory cell to generate a differential voltage signal across DIGIT and DIGIT* lines at 1302, firing an N-sense amplifier of a sense amplifier circuit to discharge the lower of the DIGIT and DIGIT* lines towards ground at 1304, limiting the discharge of the lower of the DIGIT and DIGIT* lines to prevent that line from reaching ground at 1306, and firing a P-sense amplifier of the sense amplifier circuit to pull up the higher of the DIGIT and DIGIT* lines towards Vcc. In one embodiment, the memory circuit is memory circuit 602, the differential voltage is generated across DIGIT and DIGIT* lines 726A and 726B, the N-sense amplifier is amplifier 802, and the P-sense amplifier is amplifier 804. In this embodiment, the accessing includes firing a word line for the memory cell being accessed to turn on an access transistor for that memory cell, which couples a storage capacitor for that memory cell to one of the pair of digit lines, the firing includes bringing an N-sense amplifier control signal coupled to the N-sense amplifier towards ground, and the limiting includes turning off a P-channel transistor coupled between a node of the N-sense amplifier and the lower digit line.

CONCLUSION

The above description and the accompanying drawings are intended to be illustrative, and not restrictive. Many other embodiments will be apparent to those of ordinary skill in the art upon reviewing the above description. The scope of the present invention should therefore be determined with reference to the appended claims, along with the full scope of equivalents to which such claims are entitled.

What is claimed is:

1. A sense amplifier circuit, comprising:
   a first amplifier circuit having a first node and a second node, the first amplifier circuit including a pair of cross-coupled transistors of a first channel type;
   a second amplifier circuit having a first node and a second node, the second amplifier circuit including a pair of cross-coupled transistors of a second channel type;
   a third transistor of the second channel type coupled between the first node of the first amplifier circuit and the first node of the second amplifier circuit;
   a fourth transistor of the second channel type coupled between the second node of the first amplifier circuit and the second node of the second amplifier circuit;
   a pair of complementary digit lines connected to the first node and the second node of the second amplifier circuit; and
   wherein the third and fourth transistors limit the low voltage on one of the pair of complementary digit lines to one transistor threshold voltage above the lowest voltage on the first and second nodes of the first amplifier circuit.

2. The sense amplifier circuit of claim 1, wherein the pair of cross-coupled transistors of the first amplifier circuit are N-channel field-effect transistors (FETs).

3. The sense amplifier circuit of claim 2, wherein the pair of cross-coupled transistors of the second amplifier circuit are P-channel FETs.

4. The sense amplifier circuit of claim 1, wherein the pair of cross-coupled transistors of the first amplifier circuit have a common node, the common node being coupled to a first sense control line that is used for firing the first amplifier circuit.

5. The sense amplifier circuit of claim 4, wherein the pair of cross-coupled transistors of the second amplifier circuit also have a common node which is coupled to a second sense control line that is used for firing the second amplifier circuit.

6. The sense amplifier circuit of claim 1, wherein the pair of transistors of the first amplifier circuit are N-channel FETs, and the pair of transistors of the second amplifier circuit and the third and the fourth transistors are all P-channel FETs.

7. The sense amplifier circuit of claim 1, wherein the third transistor has a gate node for controlling coupling between the first nodes of the first amplifier circuit and the second amplifier circuit in response to a limit signal, and the fourth transistor has a gate node for controlling coupling between the second nodes of the first amplifier circuit and the second amplifier circuit in response to the limit signal.

8. The sense amplifier circuit of claim 7, wherein the third and fourth transistors are P-channel FETs, and the limit signal is held at ground during a sense operation.

9. A sense amplifier circuit, comprising:
an N-sense amplifier circuit having a first node and a second node;
a P-sense amplifier circuit having a first node and a second node;
a first P-channel transistor coupled between the first node of the N-sense amplifier circuit and the first node of the P-sense amplifier circuit;
a second P-channel transistor coupled between the second node of the N-sense amplifier circuit and the second node of the P-sense amplifier circuit;
a first digit line connected to the first node of the P-sense amplifier circuit;
a complementary digit line connected to the second node of the P-sense amplifier circuit; and
wherein the first P-channel transistor and the second P-channel transistor limit the low voltage on the complementary digit line to one transistor threshold voltage above the lowest voltage on the second node of the N-sense amplifier circuit.

10. The sense amplifier circuit of claim 9, wherein the N-sense amplifier also has a control node coupled to a first control line that is used to fire the N-sense amplifier.

11. The sense amplifier circuit of claim 10, wherein the P-sense amplifier also has a control node coupled to a second control line used to fire the P-sense amplifier.

12. The sense amplifier circuit of claim 9, wherein the first P-channel transistor has a gate for controlling coupling between the first nodes of the N-sense amplifier and P-sense amplifier circuits in response to a limit signal, and the second P-channel transistor has a gate for controlling coupling between the second nodes of the N-sense amplifier and P-sense amplifier circuits also in response to the limit signal.

13. The sense amplifier circuit of claim 12, wherein the limit signal is held at ground during a sense operation.

14. A sense amplifier circuit, comprising:
a pair of N-channel transistors, the pair of N-channel transistors being cross-coupled to form an N-sense amplifier having first and second nodes;
a first pair of P-channel transistors, the first pair of P-channel transistors being cross-coupled to form a P-sense amplifier having first and second nodes;
a second pair of P-channel transistors, wherein a first one of the second pair of P-channel transistors is coupled between the first nodes of the N-sense and the P-sense amplifiers, and a second one of the second pair of P-channel transistors is coupled between the second nodes of the N-sense and the P-sense amplifiers;
a true digit line connected to the first node of the P-sense amplifier;
a complementary digit line connected to the second node of the P-sense amplifier; and
wherein the second pair of P-channel transistors operate to limit the lowest voltage on the true and the complementary digit lines to one transistor threshold voltage above the lowest voltage on the first and second nodes of the N-sense amplifier.

15. The sense amplifier circuit of claim 14, wherein the pair of N-channel transistors of the N-sense amplifier have a common node, the common node being coupled to a first sense control line that is used for firing the N-sense amplifier.

16. The sense amplifier circuit of claim 15, wherein the pair of P-channel transistors of the P-sense amplifier also have a common node which is coupled to a second sense control line that is used for firing the P-sense amplifier.

17. The sense amplifier circuit of claim 14, wherein the first one of the second pair of P-channel transistors has a gate for controlling coupling between the first nodes of the N-sense and P-sense amplifiers in response to a limit signal, and the second one of the second pair of P-channel transistors has a gate for controlling coupling between the second nodes of the N-sense and P-sense amplifiers also in response to the limit signal.

18. The sense amplifier circuit of claim 17, wherein the limit signal is held at ground during a sense operation.

19. A sense amplifier circuit, comprising:
an N-sense amplifier circuit having a first node and a second node;
a P-sense amplifier circuit having a first node and a second node, the nodes of the P-sense amplifier circuit being coupled to a complementary pair of digit lines;
a first P-channel transistor which selectively couples the first node of the P-sense amplifier circuit to the first node of the N-sense amplifier circuit; and
a second P-channel transistor which selectively couples the second node of the P-sense amplifier circuit to the second node of the N-sense amplifier circuit; and
wherein the first P-channel transistor and the second P-channel transistor serve to limit the lowest voltage on the complementary pair of digit lines to one transistor threshold voltage above the lowest voltage on the first and second nodes of the N-sense amplifier circuit.

20. The sense amplifier circuit of claim 19, wherein the N-sense amplifier also has a control node coupled to a first control line used to fire the N-sense amplifier.

21. The sense amplifier circuit of claim 20, wherein the P-sense amplifier also has a control node coupled to a second control line used to fire the P-sense amplifier.

22. The sense amplifier circuit of claim 19, wherein the first P-channel transistor has a gate for controlling coupling between the first nodes of the N-sense amplifier and P-sense amplifier circuits in response to a limit signal, and the second P-channel transistor has a gate for controlling coupling between the second nodes of the N-sense amplifier and P-sense amplifier circuits also in response to the limit signal.

23. The sense amplifier circuit of claim 22, wherein the limit signal is held at ground during a sense operation.

24. The sense amplifier circuit of claim 23, wherein, during the sense operation, one of the digit lines is a low voltage digit line and one of the first and the second P-channel transistors prevents the low voltage digit line from discharging to zero volts.

25. A sense amplifier circuit, comprising:
a pair of N-channel transistors, the pair of n-channel transistors being cross-coupled to form an N-sense amplifier having first and second nodes;
a first pair of P-channel transistors, the first pair of P-channel transistors being cross-coupled to form a P-sense amplifier having first and second nodes, the nodes of the P-sense amplifier being coupled to a complementary pair of digit lines, wherein a first one of the first pair of P-channel transistors has a gate coupled to the second node of the N-sense amplifier, and a second one of the first pair of P-channel transistors has a gate coupled to the first node of the N-sense amplifier;
a second pair of P-channel transistors, wherein a first one of the second pair of P-channel transistors is coupled between the first nodes of the N-sense and the P-sense amplifiers, and a second one of the second pair of P-channel transistors is coupled between the second nodes of the N-sense and the P-sense amplifiers; and
wherein the second pair of P-channel transistors serve to limit the lowest voltage on the complementary pair of digit lines to one transistor threshold voltage above the lowest voltage on the first or second node of the N-sense amplifier.

26. The sense amplifier circuit of claim 25, wherein the pair of N-channel transistors of the N-sense amplifier have a common node, the common node being coupled to a first sense control line that is used for firing the N-sense amplifier.

27. The sense amplifier circuit of claim 26, wherein the first pair of P-channel transistors of the P-sense amplifier also have a common node which is coupled to a second sense control line that is used for firing the P-sense amplifier.

28. The sense amplifier circuit of claim 25, wherein the first one of the second pair of P-channel transistors has a gate for controlling coupling between the first nodes of the N-sense and P-sense amplifiers in response to a limit signal, and the second one of the second pair of P-channel transistors has a gate for controlling coupling between the second nodes of the N-sense and P-sense amplifiers also in response to the limit signal.

29. The sense amplifier circuit of claim 28, wherein the limit signal is held at ground during a sense operation.

30. A memory circuit, comprising:
a memory array, the memory array having multiple rows of word lines and multiple columns of digit lines, wherein intersections of the multiple rows of word lines and the multiple columns of digit lines comprises multiple memory cells; and
a sense amplifier circuit coupled to the memory array, the sense amplifier circuit including multiple sense amplifiers, each sense amplifier comprising:
a first amplifier having a first node and a second node, the first amplifier including a pair of cross-coupled transistors of a first channel type;
a second amplifier having a first node and a second node, the second amplifier including a pair of cross-coupled transistors of a second channel type, the nodes of the second amplifier coupled to a complementary pair of the digit lines;
a third transistor of the second channel type coupled between the first node of the first amplifier and the first node of the second amplifier;
a fourth transistor of the second channel type coupled between the second node of the first amplifier and the second node of the second amplifier; and
wherein the third and fourth transistors limit the low voltage on one of the complementary pair of the digit lines to one transistor threshold voltage above the lowest voltage on the first and second nodes of the first amplifier circuit.

31. The memory circuit of claim 30, further comprising:
a column decoder circuit coupled to the sense amplifier circuit;
a row decoder circuit coupled to the multiple rows of word lines;
an input/output (I/O) control circuit coupled to the column decoder circuit, the I/O control circuit for coupling I/O lines to the column decoder circuit; and
a control circuit coupled to the sense amplifier circuit, the column decoder circuit, the row decode circuit, and the I/O control circuit, the control circuit for providing control signals for controlling operations of the memory circuit.

32. The memory circuit of claim 30, wherein the pair of cross-coupled transistors of the first amplifier of each sense amplifier are N-channel FETs.

33. The memory circuit of claim 32, wherein the pair of cross-coupled transistors of the second amplifier of each sense amplifier are P-channel FETs.

34. The memory circuit of claim 30, wherein the pair of cross-coupled transistors of the first amplifier of each sense amplifier have a common node which is coupled to a first sense control line that is used for firing that first amplifier circuit.

35. The memory circuit of claim 34, wherein the pair of cross-coupled transistors of the second amplifier of each sense amplifier also have a common node which is coupled to a second sense control line used for firing that second amplifier circuit.

36. The memory circuit of claim 30, wherein the pair of transistors of the first amplifier of each sense amplifier are N-channel FETs, and the pair of transistors of the second amplifier and the third and the fourth transistors are all P-channel FETs.

37. The memory circuit of claim 30, wherein the third transistor of each sense amplifier has a gate node for controlling coupling between the first nodes of the first amplifier and the second amplifier in response to a limit signal, and the fourth transistor has a gate node for controlling coupling between the second nodes of the first amplifier and the second amplifier also in response to the limit signal.

38. The memory circuit of claim 37, wherein the third and fourth transistors of each sense amplifier are P-channel FETs, and the limit signal is held at ground during a sense operation.

39. A dynamic random access memory (DRAM) circuit, comprising:
a DRAM memory array having multiple rows of word lines and multiple columns of digit lines, wherein intersections of the multiple rows of word lines and the multiple columns of digit lines comprises multiple DRAM memory cells; and
a sense amplifier circuit coupled to the memory array, the sense amplifier circuit including multiple sense amplifiers, each sense amplifier comprising:
an N-sense amplifier circuit having a first node and a second node;
a P-sense amplifier circuit having a first node and a second node;

a first P-channel transistor coupled between the first node of the N-sense amplifier circuit and the first node of the P-sense amplifier circuit; and a second P-channel transistor coupled between the second node of the N-sense amplifier circuit and the second node of the P-sense amplifier circuit;

a first digit line of the multiple columns of digit lines connected to the first node of the P-sense amplifier circuit;

a complementary digit line of the multiple columns of digit lines and complementary to the first digit line and being connected to the second node of the P-sense amplifier circuit; and wherein the first P-channel transistor and the second P-channel transistor limit the low voltage on the complementary digit line or the first digit line to one transistor threshold voltage above the lowest voltage on the first or second node of the N-sense amplifier circuit.

40. An electronic system, comprising:
a central processing unit (CPU);
a memory device, the memory device comprising:
  a memory array having multiple rows of word lines and multiple columns of digit lines, wherein intersections of the multiple rows of word lines and the multiple columns of digit lines comprises multiple memory cells; and
  a sense amplifier circuit, coupled to the memory array, including multiple sense amplifiers, each sense amplifier comprising:
    a first amplifier having a first node and a second node, and including a pair of cross-coupled transistors of a first channel type;
    a second amplifier having a first node and a second node, and including a pair of cross-coupled transistors of a second channel type, the nodes of the second amplifier being coupled to a complementary pair of the digit lines;
    a third transistor of the second channel type coupled between the first node of the first amplifier and the first node of the second amplifier; and
    a fourth transistor of the second channel type coupled between the second node of the first amplifier and the second node of the second amplifier;
  a pair of complementary digit lines connected to the first node and the second node of the second amplifier circuit;
  wherein the third and fourth transistors limit the lowest voltage on one of the pair of complementary digit lines to one transistor threshold voltage above the lowest voltage on the first or second nodes of the first amplifier circuit; and
a system bus for communicatively coupling the CPU and the memory device.

41. A method of forming a sense amplifier circuit, comprising:
  forming an N-sense amplifier having first and second nodes;
  forming a P-sense amplifier having first and second nodes;
  forming a first P-channel transistor between the first nodes of the N-sense and P-sense amplifiers;
  forming a second P-channel transistor between the second nodes of the N-sense and P-sense amplifiers;
  forming a first digit line connected to the first node of the P-sense amplifier circuit;
  forming a complementary digit line connected to the second node of the P-sense amplifier circuit; and
  wherein the first P-channel transistor and the second P-channel transistor are formed to limit the low voltage on the complementary digit line to one transistor threshold voltage above the lowest voltage on the second node of the N-sense amplifier circuit.

42. The method of claim 41, further comprising providing cross-coupled connections for the N-sense and P-sense amplifiers at the first and second nodes of the N-sense amplifier.

43. The method of claim 41, further comprising providing connections for a complementary digit line pair at the first and second nodes of the P-sense amplifier.

44. The method of claim 41, further comprising providing connections for a LIMIT signal to gates of the first and second P-channel transistors.

45. The method of claim 41, wherein forming the N-sense amplifier includes forming a first common node, forming the P-sense amplifier includes forming a second common node, and further comprising providing connections for an NSA* signal to the first common node and for a PSA signal to the second common node.

46. A method of forming a sense amplifier circuit, comprising:
  forming a pair of cross-coupled N-channel transistors;
  forming a first pair of P-channel transistors;
  forming a second pair of P-channel transistors, the second pair of P-channel transistors being formed between the pair of N-channel transistors and the first pair of P-channel transistors;
  forming a true digit line and a complementary digit line connected to the P-sense amplifier; and
  wherein the second pair of P-channel transistors operate to limit the lowest voltage on the true and the complementary digit lines to one transistor threshold voltage above the lowest voltage of the N-sense amplifier.

47. The method of claim 46, further comprising providing cross-coupled gate connections between the pair of N-channel transistors and the second pair of P-channel transistors.

48. The method of claim 46, further comprising providing connections for a complementary digit line pair between the first and second pairs of P-channel transistors.

49. The method of claim 46, further comprising providing connections for a LIMIT signal to gates of the second pair of P-channel transistors.

50. A method of sensing a memory cell in a memory circuit, comprising:
  accessing a memory cell to generate a differential voltage signal across a pair of complementary digit lines; and
  sensing the differential voltage signal using a sense amplifier circuit which includes a first sense amplifier of a first channel type and a second sense amplifier of a second channel type, wherein the sensing includes:
    firing the first sense amplifier to move a first one of the digit lines towards a predetermined potential; and
    limiting the movement of the first one of the digit lines to prevent the first one of the digit lines from reaching the predetermined potential.

51. The method of claim 50, wherein the accessing includes firing a word line for the memory cell being accessed to turn on an access transistor for that memory cell.

52. The method of claim 51, wherein the accessing further includes coupling a storage capacitor for the memory cell being accessed to one of the pair of digit lines.

53. The method of claim 50, wherein the firing includes bringing a control signal for the first sense amplifier from a bias voltage towards the predetermined potential.

54. The method of claim 50, wherein the limiting includes turning off a transistor coupled between a node of the first sense amplifier and the first one of the digit lines.

55. The method of claim 50, wherein the sensing further includes firing the second sense amplifier to move a second one of the digit lines towards a second predetermined voltage that is different from the first predetermined voltage.

56. A method of sensing a memory cell in a memory circuit, comprising:
accessing a memory cell to generate a differential voltage signal across a pair of complementary digit lines, the pair of complementary digit lines including a low voltage digit line and a high voltage digit line; and
sensing the differential voltage signal using a sense amplifier circuit which includes an N-sense amplifier and a P-sense amplifier, wherein the sensing includes:
firing the N-sense amplifier to discharge the low voltage digit line towards ground; and
limiting the discharge of the low voltage digit line to prevent the low voltage digit line from reaching ground.

57. The method of claim 56, wherein the accessing includes firing a word line for the memory cell being accessed to turn on an access transistor for that memory cell.

58. The method of claim 57, wherein the accessing further includes coupling a storage capacitor for the memory cell being accessed to one of the pair of digit lines.

59. The method of claim 56, wherein the firing includes bringing an N-sense amplifier control signal coupled to the N-sense amplifier towards ground.

60. The method of claim 56, wherein the limiting includes turning off a P-channel transistor coupled between a node of the N-sense amplifier and the low voltage digit line.

61. The method of claim 60, wherein the limiting further includes providing a limit signal to turn off the P-channel transistor.

62. The method of claim 56, wherein the sensing further includes firing the P-sense amplifier to pull up the high voltage digit line.

63. A sense amplifier, comprising:
an n-sense amplifier circuit having cross-coupled pair of n-type transistors in which,
a first n-type transistor of the cross-coupled pair of n-type transistors having a gate connected to a first source/drain contact of a second n-type transistor of the cross-coupled pair of n-type transistors thereby forming a first node;
the second n-type transistor having a gate connected to a first source/drain contact of the first n-type transistor thereby forming a second node;
a second source/drain contact of the first n-type transistor connected to a second source/drain contact of the second n-type transistor thereby forming a node to receive an n-sense activation signal;
a p-sense amplifier circuit having cross-coupled pair of p-type transistors in which,
a first p-type transistor of the cross-coup led pair of p-type transistors having a gate connected to the first node;
the second p-type transistor having a gate connected to the second node;
a first source/drain contact of the first p-type transistor connected to a first source/drain contact of the second p-type transistor thereby forming a node to receive a p-sense activation signal;
a first p-type limit transistor in which,
a first source/drain contact of the first p-type limit transistor connected to a second source/drain contact of the first p-type transistor of the p-sense amplifier circuit and which is also connected to a complementary digit line;
a second source/drain contact of the first p-type limit transistor connected to the second node;
a gate of the first p-type limit transistor connected to a limit signal;
a second p-type limit transistor in which,
a first source/drain contact of the second p-type limit transistor connected to a second source/drain contact of the second p-type transistor of the p-sense amplifier circuit and which is also connected to a true digit line;
a second source/drain contact of the second p-type limit transistor connected to the first node;
a gate of the second p-type limit transistor connected to the limit signal; wherein,
the lowest voltage on the complementary digit line is at least one p-type transistor threshold voltage above the lowest voltage on the second node during a sensing operation when the limit signal is at approximately zero volts;
the lowest voltage on the true digit line is at least one p-type transistor threshold voltage above the lowest voltage on the second node during a sensing operation; and
the limit signal is driven negative during an equilibrate cycle so that the digit lines can be equilibrated to an equal voltage.

64. A method of sensing a memory cell in a memory circuit having a first supply voltage of $V_{CC}$ and a second supply voltage of $V_{SS}$, where $V_{CC}$ is greater than $V_{SS}$, the method comprising:
accessing a memory cell to generate a small differential voltage signal across a pair of digit lines, the differential voltage signal comprising a first voltage on a true digit line and a second voltage on a complementary digit line, the first voltage having a slightly higher potential with respect to the second voltage;
sensing the differential voltage signal using a sense amplifier circuit which includes an n-type sense amplifier and a p-type sense amplifier, wherein the sensing includes:
activating the n-sense amplifier to move the complementary digit line toward $V_{SS}$;
activating the p-sense amplifier to move the true digit line to $V_{CC}$; and
limiting the movement of the complementary digit line to prevent the complementary digit line from reaching $V_{SS}$.

65. The method of claim 64, wherein limiting the movement of the complementary digit line to a voltage threshold $V_{TH}$ above $V_{SS}$.

66. A method of sensing a memory cell in a memory circuit, comprising:
applying a first supply voltage $V_{CC}$ to the memory device;
applying a second supply voltage of $V_{SS}$ to memory device where $V_{CC}$ is greater than $V_{SS}$;
accessing a memory cell to generate a differential voltage signal across a pair of digit lines,
activating an n-sense amplifier to move a first digit line of the pair of digit lines toward $V_{SS}$;
activating a p-sense amplifier to move a second digit line of the pair of digit lines toward $V_{CC}$; and
limiting the movement of the first digit line to one transistor threshold $V_{th}$ above $V_{SS}$.

* * * * *

UNITED STATES PATENT AND TRADEMARK OFFICE
CERTIFICATE OF CORRECTION

PATENT NO.   : 6,522,592 B2
DATED        : February 18, 2003
INVENTOR(S)  : Scott Van De Graaff It is certified that error appears in the above-identified patent and that said Letters Patent is hereby corrected as shown below:

Column 8,
Line 17, delete "cc/2" and insert -- Vcc/2 -- therefor.

Column 14,
Line 18, delete "row decode" and insert -- row decoder -- therefor.

Column 17,
Line 53, delete "cross-coup led" and insert -- cross-coupled -- therefor.

Column 18,
Line 49, insert -- includes limiting -- after "limiting".
Line 50, delete "voltage threshold" and insert -- voltage of one transistor threshold voltage -- therefor.
Line 55, insert -- of -- between "voltage" and "$V_{cc}$".

Signed and Sealed this

Sixteenth Day of December, 2003

JAMES E. ROGAN
*Director of the United States Patent and Trademark Office*